United States Patent [19]

Sakamoto et al.

[11] Patent Number: 5,051,556
[45] Date of Patent: Sep. 24, 1991

[54] CHARGED PARTICLE BEAM LITHOGRAPHY SYSTEM AND A METHOD THEREOF

[75] Inventors: Kiichi Sakamoto, Tokyo; Hiroshi Yasuda, Yokohama; Akio Yamada, Kawasaki, all of Japan

[73] Assignee: Fujitsu Limited, Kawasaki, Japan

[21] Appl. No.: 429,500

[22] Filed: Oct. 31, 1989

[30] Foreign Application Priority Data

Oct. 31, 1988 [JP] Japan .............................. 63-275336
Mar. 20, 1989 [JP] Japan .............................. 1-68308
Jul. 14, 1989 [JP] Japan .............................. 1-182151

[51] Int. Cl.$^5$ .......................................... B23K 15/00
[52] U.S. Cl. ........................ 219/121.25; 250/396 ML; 250/492.2
[58] Field of Search ................. 219/121.25, 121.26, 219/121.27, 121.19, 121.20; 250/396 ML, 492.2

[56] References Cited

U.S. PATENT DOCUMENTS 4,585,943  4/1986  Yasuda et al. ............... 250/396 ML
4,914,304  4/1990  Koyama ....................... 250/492.2

Primary Examiner—C. L. Albritton
Attorney, Agent, or Firm—Staas & Halsey

[57] ABSTRACT

A charged particle beam lithography system comprises a beam source of a charged particle beam, a beam shaping aperture for providing a predetermined cross section to the charged particle beam, a first focusing system for focusing the charged particle beam on a first crossover point located on the optical axis, a second focusing system provided between the first crossover point and an object for focusing the charged particle beam on a second crossover point located on the optical axis, a beam deflection system for deflecting the electron beam such that the beam is moved over the surface of the object, a stage for supporting the object, a mask provided in a vicinity of said first focusing system, and addressing system for selectively deflecting the charged particle beam such that the charged particle beam is passed through a selected aperture on the mask, wherein the addressing system comprises an electrostatic deflector for variable shaping of the charged particle beam and an electromagnetic deflector for deflecting the charged particle beam such that the charged particle beam is selectively passed through selected one of the plurality of apertures except for the predetermined aperture.

19 Claims, 12 Drawing Sheets

CHARGED PARTICLE BEAM LITHOGRAPHY SYSTEM AND A METHOD THEREOF

BACKGROUND OF THE INVENTION

The present invention generally relates to charged particle beam lithography and more particularly to a charged particle beam lithography system suitable for writing a semiconductor pattern on a semiconductor wafer and a method of writing such a pattern at a high speed.

With the continuous demand to increase the integration density of integrated circuits, new lithography technique such as electron beam lithography or X-ray lithography is now under intensive study. Some of them are already in use.

In the case of the electron beam lithography, an extremely fine patterning according to the micron- or submicron-rule is possible by using a focused electron beam having an extremely small beam spot which may have a diameter of one micron or less. Conventionally, a so-called Gaussian beam having a circular beam spot with the Gaussian distribution for the electron intensity in the beam or a so-called shaped beam having a shaped beam cross section, which may be rectangular or triangular for example, is used while moving a stage supporting a wafer continuously or stepwise. In any of these techniques, however, there is a limitation in the speed of patterning because of the essential nature of the electron beam lithography in which the pattern is written on the wafer by the electron beam in "one stroke".

In the electron beam lithography, there is a problem in that the number of shots is increased when an electron beam having a small beam diameter is used and as a result, there arises a problem that a long time is needed when exposing or filling a large area of the wafer. For example, one hundred shots are needed when exposing a square pattern having a size of 10 $\mu m \times 10$ $\mu m$ by an electron beam having a square cross section with a beam size of 1 $\mu m \times 1$ $\mu m$. When the beam size is 0.5 $\mu m \times 0.5$ $\mu m$, on the other hand, four hundred shots becomes necessary. Associated therewith, the throughput of the patterning is further deteriorated.

In order to avoid the foregoing problem of excessive increase of the number of shots, a system shown in FIG. 1 is conventionally used in which an electron beam produced by an electron gun 1 is deflected by an electrostatic deflector 4 after passing through a shaping aperture 2 and an electromagnetic lens 3 such that the electron beam selectively falls on a designed pattern $6a$ provided on a stencil mask 5 in a form of aperture having a predetermined shape corresponding to the elementary pattern of the semiconductor device to be patterned. After passing through the mask 5, the electron beam now having a shape corresponding to the pattern $6a$ is focused on a wafer 7 by electron lenses 8 and 9. On the mask 5, there are further provided a rectangular or triangular aperture $6b$ and the cross section of the electron beam can be changed as desired by directing the electron beam to hit at least a part of the aperture $6b$ by controlling the electrostatic deflector 4. By controlling the deflector 4 such that only a small part of the electron beam is passed through the aperture $6b$, the size of the electron beam is reduced. When the deflector 4 is controlled such that a large part of the electron beam is passed through the aperture $6b$, the size of the electron beam is increased.

FIG. 2(A) shows a typical prior art mask 5 in more detail. The mask 5 generally comprises a silicon base body $5a$ on which a plurality of regions 6 are defined, wherein the predetermined patterns such as patterns $6a_{-1}$-$6a_{-3}$ are formed in the region 6 in a form of the aperture as is clearly seen from the cross sectional view of FIG. 2(B). Note that the regions 6 are defined within an area $5b$ of the mask which can be addressed by the deflection of the electron beam B. Further, there is provided a single large cutout corresponding to the aperture $6b$ in one of the regions 6 as shown in FIG. 2(A) for variable shaping of the electron beam B.

After the foregoing shaping of the electron beams, the beam B having a desired cross section is moved over the wafer 7 by a deflection system (not shown) provided above the wafer 7 and a semiconductor pattern $7a$ comprising a repetition of patterns such as the pattern $6a_{-3}$ and the like is written as a result of the movement of the beam B relative to the wafer 7 as shown in FIG. 2(C). In FIG. 2(C), a marginal area written on the wafer 7 is represented as an area $7b$.

Such electron beam lithography using the mask is effective in patterning a semiconductor device particularly when the device comprises a repetition of a limited number of fundamental or elementary patterns such as dynamic random access memory (DRAM). Thus, there are proposed a number of variations based on this technique as described in the Japanese Laid-open Patent Application No. 52-119185 in which the fundamental patterns are arranged on the mask in a row and column formation or as in the Japanese Laid-open Patent Application No. 62-260322 in which the designed patterns and the aperture for the variable shaping of the electron beam are provided on a diaphragm.

In the foregoing electron beam lithography system, it should be noted that the electrostatic deflector 4 is used to deflect the electron beam. As the electrostatic deflector has a response time of about 0.1–1 $\mu$sec, the system can change the size and shape of the spot of the electron beam quickly between one shot and a next shot. However, the electrostatic deflector cannot produce a large beam deflection because of the practical limitation in the voltage applicable across a pair of electrodes forming the deflector. When an excessive voltage is applied to the electrostatic deflector, there is a substantial risk that an electrical discharge is established between the electrodes and the control of the electron beam is lost. Thus, the deflection angle which can be obtained by the electrostatic deflector is limited and associated therewith, there is a problem in that the number of patterns which can be selected on the mask is limited.

Further, the prior art system of FIG. 1 has a problem in that the electron lens 8 has a spherical abberation and an image formed on the wafer 7 in correspondence to the spot of the electron beam passed through the designed pattern tends to be blurred when the selected pattern is located at a marginal area far from the optical axis of the electron lens 8.

Furthermore, there is another problem in the prior art system in that the image focused on the wafer 7 by the electron beam is unwantedly demagnified. Referring to FIG. 3 showing a part around the lens 8 in an enlarged scale, the electron beam incident to the lens 8, which may comprise a first lens $8a$ and a second lens $8b$ as shown in the drawing, obliquely along a first path A (referred to as a beam A) is spread relative to the electron beam incident perpendicularly to the lens 8 along a second path B passing straight through the center of the lens (referred to as a beam B). As a result, a relatively large proportion of the electron beam A is stopped by the designed pattern 6a as compared to the beam B, which is interrupted by the pattern 6b, even when the size of the aperture is identical in the pattern 6a and the pattern 6b. When the electron beams thus shaped by the mask 5 is focused by the second lens 8b at a crossover point C, the angular aperture for the electron beam A becomes smaller than the that of the electron beam B and the image of the pattern focused on the wafer 7 by the beam A is unwantedly compressed or demagnified.

SUMMARY OF THE INVENTION

Accordingly, it is a general object of the present invention to provide a novel and useful charged particle beam lithography system wherein the problems aforementioned are eliminated.

Another and more specific object of the present invention is to provide a charged particle beam lithography system wherein a large variety of patterns are provided on a mask and a desired pattern is selectively used by deflecting a charged particle beam for a large deflection angle.

Another object of the present invention is to provide a charged particle beam lithography system, wherein a variable shaping of the beam can be performed instantaneously between one shot and a next shot.

Another object of the present invention is to provide a charged particle beam lithography system wherein formation of blur in a focused pattern caused by the spherical abberation of an electromagnetic lens is eliminated.

Another object of the present invention is to provide a charged particle beam lithography system wherein the unwanted demagnification of a focused pattern on a semiconductor wafer is eliminated.

Another object of the present invention is to provide a charged particle beam lithography system wherein a large deflection of a charged particle beam for addressing various patterns on a mask is made by an electromagnetic deflector while a small deflection for variable shaping of the beam is made by an electrostatic deflector.

Another object of the present invention is to provide a charged particle beam lithography system for exposing an semiconductor wafer by a charged particle beam passed selectively through a plurality of apertures provided on a mask, comprising electrostatic deflection means and at least one electromagnetic deflection means for shaping the charged particle beam, wherein said electromagnetic deflection means deflects the charged particle beam such that the beam is passed through one of the apertures for providing a predetermined shape to the cross section of the charged particle beam and said electrostatic deflection means deflects the charged particle beam such that the beam is passed through a particular aperture on the mask for providing a variable shaped cross section to the charged particle beam. According to the present invention, a number of predetermined patterns can be selected by deflecting the charged particle beam for a large angle by using the electromagnetic deflection means and the efficiency of the patterning process is improved. Further, when performing the exposure using the variable shaped beam, the shape of the charged particle beam can be changed instantaneously by using the electrostatic deflector and the efficiency of the patterning is improved also in this case.

Another object of the present invention is to provide a charged particle beam lithography system for exposing an semiconductor wafer by a charged particle beam passed selectively through a plurality of apertures provided on a mask which in turn is provided inside an electromagnetic lens system, comprising first deflector means provided so as to deflect the charged particle beam proceeding along an optical axis away from the optical axis, second deflector means provided so as to deflect the charged particle beam deflected by the first deflector means such that the beam passes through the selected aperture in a direction substantially perpendicular to the mask, third deflector means provided so as to deflect the charged particle beam passed through the mask toward the optical axis and fourth deflector means provided so as to deflect the charged particle beam deflected by the third deflector means such that the electron beam travels along the optical axis. According to the present invention, the spherical abberation of the electron magnetic lens system is eliminated by displacing the charged particle beam away from the optical axis while maintaining a parallel relationship after the beam has entered into the lens system and by returning the beam to the optical axis before the charged particle beam is exited from the lens system. Further, the foregoing problem of unwanted demagnification of the image associated with the oblique incidence of the charged particle beam to the electromagnetic lens system is successfully eliminated as the charged particle beam is entered and exited in and from the electromagnetic lens system substantially in coincidence with the optical axis.

Another object of the present invention is to provide a method of writing a semiconductor pattern on a semiconductor wafer by a charged particle beam passed selectively through a plurality of apertures provided on a mask which in turn is provided inside an electron lens system, comprising steps of deflecting the charged particle beam proceeding along an optical axis selectively to one of said plurality of apertures by energizing first deflection means, deflecting the charged particle beam deflected by the foregoing first deflector means by energizing second deflection means such that the beam passes through the selected aperture in a direction substantially perpendicular to the mask, deflecting the charged particle beam passed through the mask by energizing third deflection means toward the optical axis, and deflecting the charged particle beam deflected by the third deflector means by energizing fourth deflection means such that the beam is propagated along the optical axis, wherein said third and fourth deflection means are energized according to a linearly independent combination of a parameter $\theta_p^s$ specifying a lateral offset of the charged particle beam passing through the selected aperture on the mask and another parameter $\theta^b$ specifying an angular offset of the foregoing charged particle beam passing through the mask as:

$$X = -\theta_p^s + \alpha \cdot \theta^b;$$

and $$Y = +\theta_p^s + \beta \cdot \theta^b$$

where X stands for an electric energization of the third deflection means, Y stands for an electric energization of the fourth deflection means and $\alpha$ and $\beta$ are constants. According to the present invention, the adjustment of the charged particle beam for the beam alignment is performed easily as the lateral offset and the angular offset of the charged particle beam can be performed independently. Note that when the parameters X and Y are changed independently, in other words when the third and fourth deflection means are energized independently, the lateral offset and the angular offset of the charged particle beam passing through the mask are changed simultaneously and the proper alignment of the beam becomes extremely difficult.

Other objects and further features of the present invention will become apparent from the following detailed description when read in conjunction with attached drawings.

DETAILED DESCRIPTION

Figure 4:
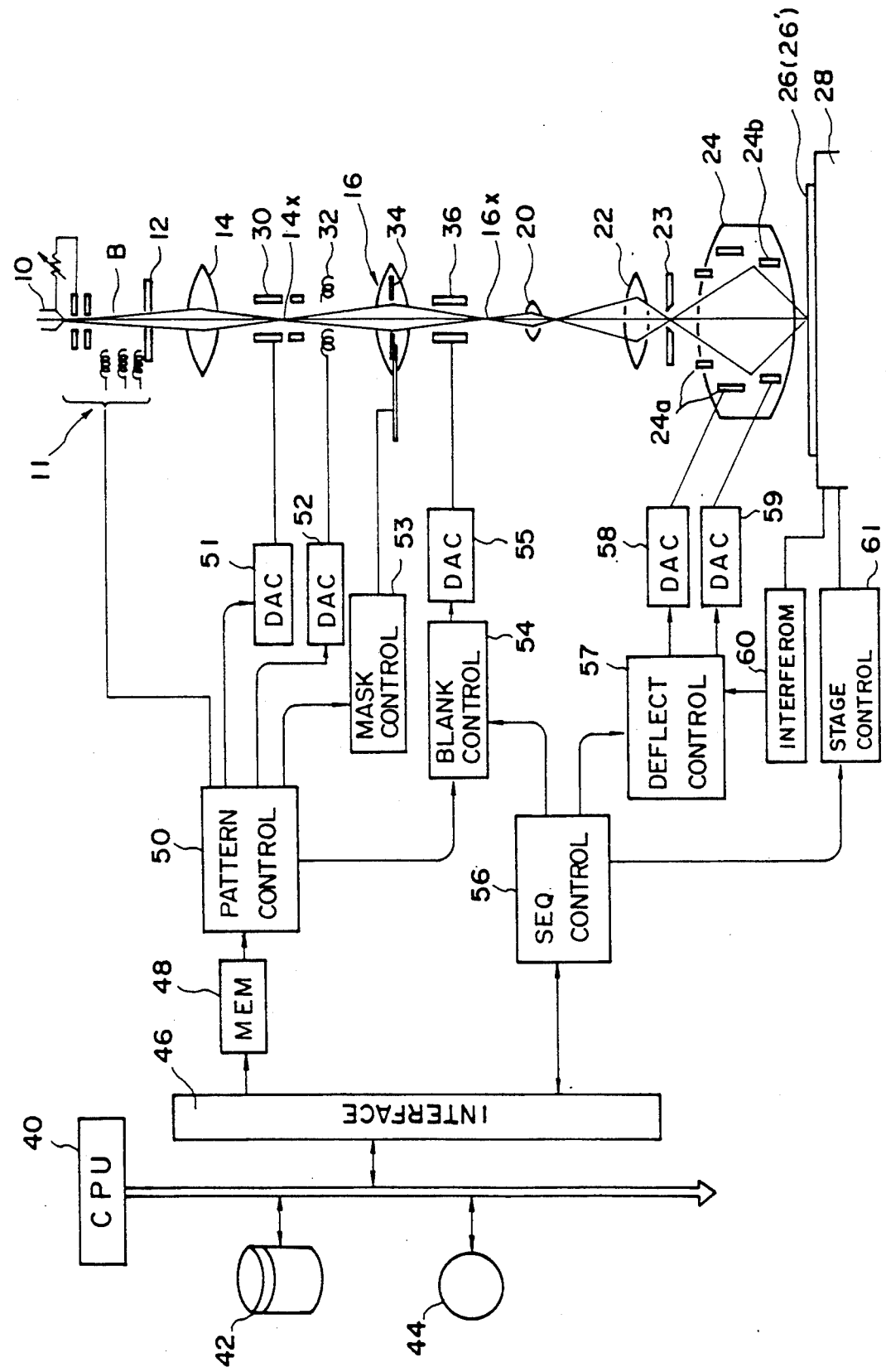
FIG. 4 is a diagram showing an overall construction of the electron beam lithography system according to an embodiment of the present invention.

FIG. 4 shows an overall construction of the electron beam lithography system according to an embodiment of the present invention.

Referring to the drawing, an electron beam B produced by an electron gun 10 is, after adjustment by an electron beam adjusting system 11, shaped by passing through an aperture 12 and is focused at a crossover point 14x by an electron lens 14. The beam B is then entered to an electron lens 16 to be described and is focused at a second crossover point 16x. In a vicinity of the lens 16, a mask 34 to be described is provided and the electron beam is shaped by passing through the aperture 12 and the mask 34. Further, the electron beam is passed through demagnification lenses 20 and 22, and after passing through a round aperture 23, is converged by an objective lens system 24 such that a pattern carried on the mask 34 is formed on a semiconductor wafer 26 which in turn is held by a stage 28. The lens system 24 further includes an electromagnetic main deflector 24a and an electrostatic sub-deflector 24b for deflecting the electron beam on the wafer 26 so that the electron beam is moved over the surface of the wafer 26 to a desired position.

Figure 3:
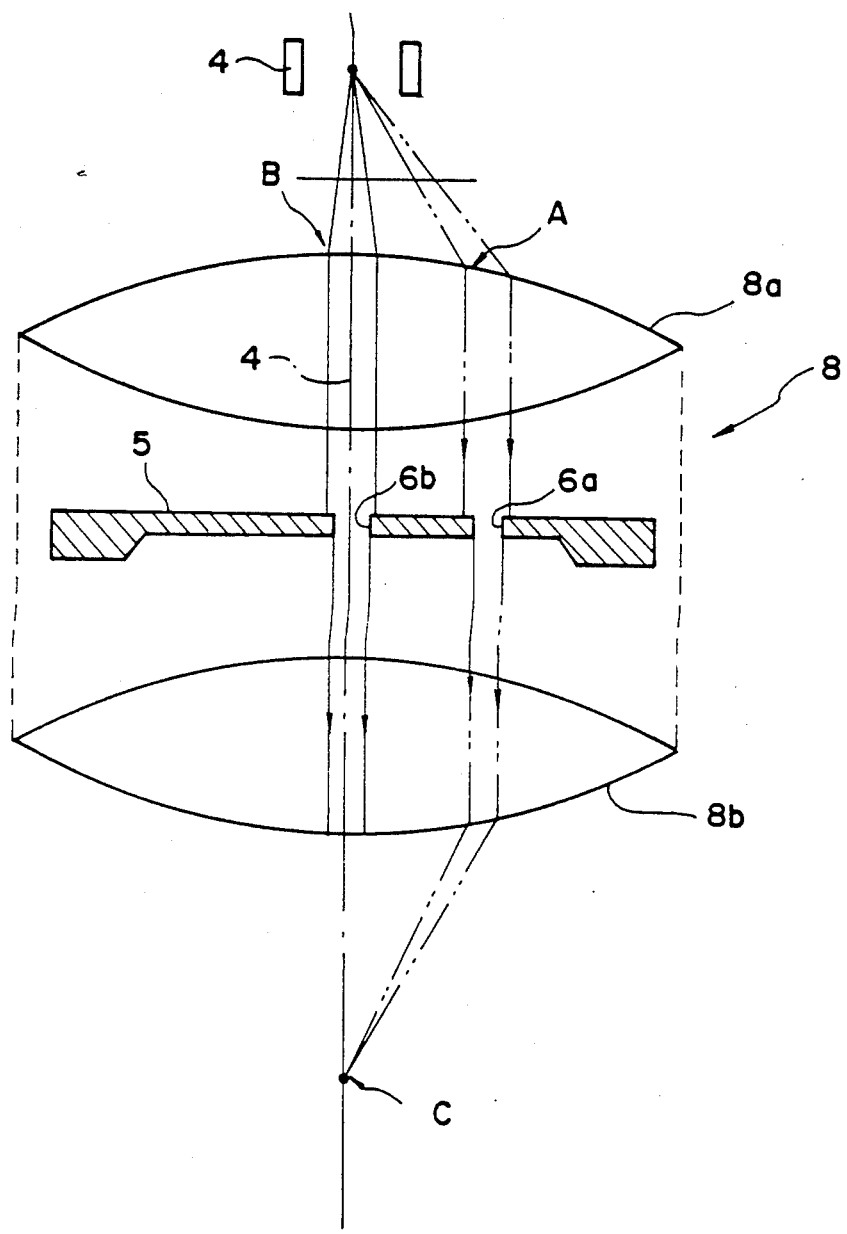
FIG. 3 is an enlarged view showing a part of the system of FIG. 1.

The system of the present invention further comprises the foregoing stencil mask 34 carrying a plurality of apertures in a vicinity of or inside of the lens 16, and an electrostatic deflector 30 as well as an electromagnetic deflector 32 are further provided above the mask 34 for deflecting the electron beam B to a desired position on the mask 34. As illustrated in FIG. 3, the deflector 30 and the deflector 32 are provided between the electron lens 14 and the electron lens 16.

Figure 2A:
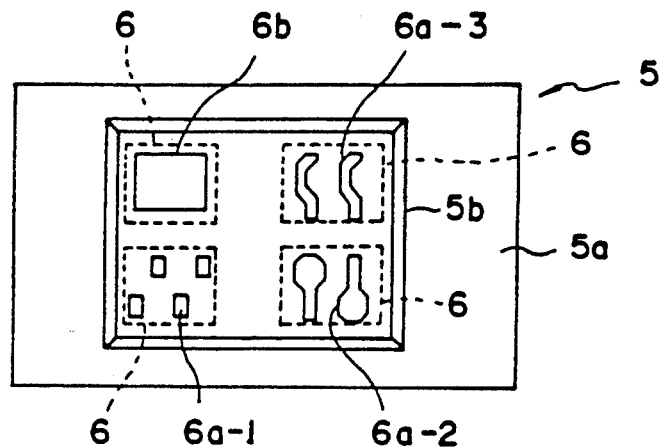
FIGS. 2(A) and (B) are diagrams showing a prior art mask used in the system of FIG. 1.
Figure 2B:
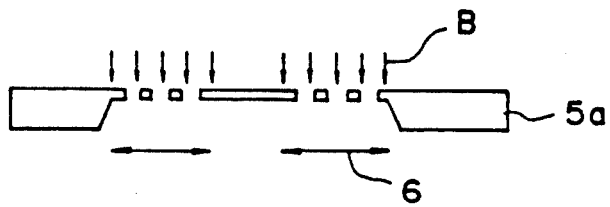
FIG. 2(C) is a diagram showing an example of the patterns written on a wafer in the system of FIG. 1.
Figure 2C:
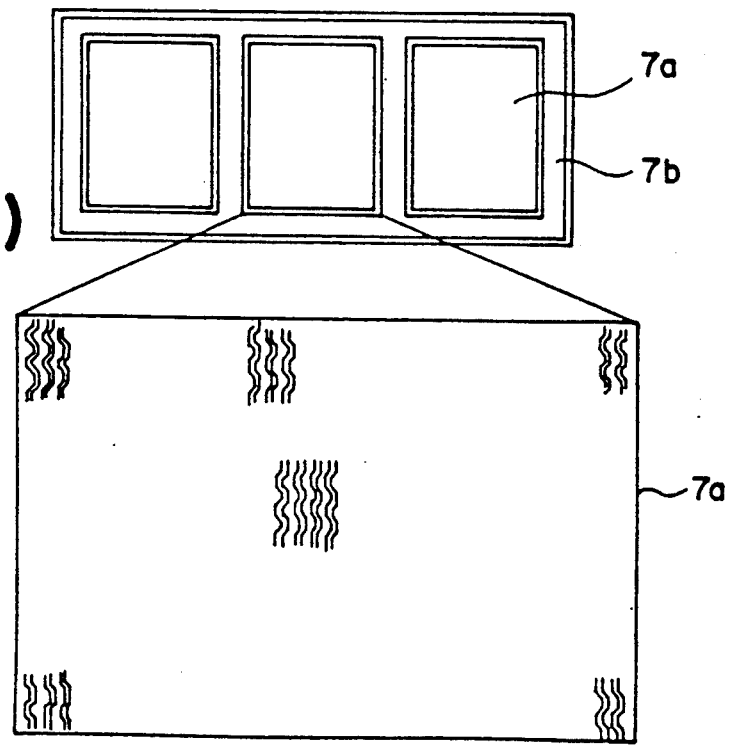
Figure 5:
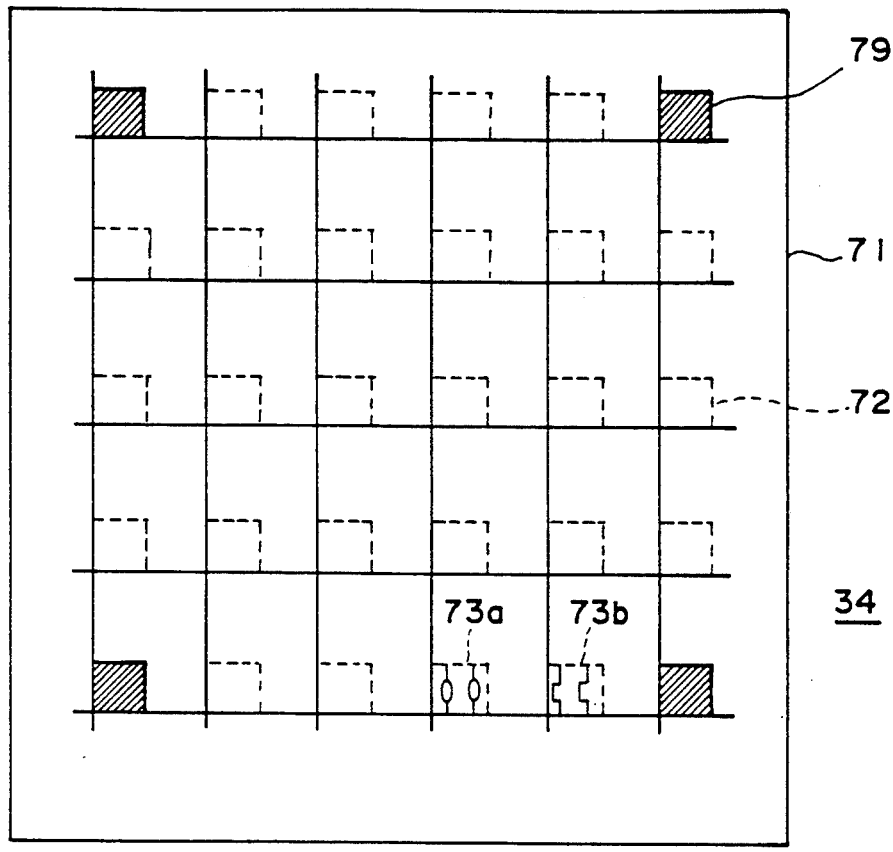
FIG. 5 is a diagram showing a region of a mask used in the system of FIG. 4 which can be addressed by the electron beam.

FIG. 5 shows the general construction of the mask 34. On the mask 34, there is defined an area 71 which can be addressed by the electron beam B and a number of regions 72 are defined on the area 71 in correspondence to the region 6 of the prior art mask of FIG. 2(A). As the electromagnetic deflector 32 is used for addressing the regions 72 on the mask 34, the area 71 can be set substantially larger than the area 5b of the prior art mask 5 and a large variety of patterns such as a pattern 73a or 73b can be provided on the mask 34 without problem. In one example, the area 71 may have a size of 2-5 mm. In correspondence thereto, a range of deflection of about ±2.5 mm is needed for the electron beam. By using the electromagnetic deflector 32, such an area is easily covered.

Figure 6:
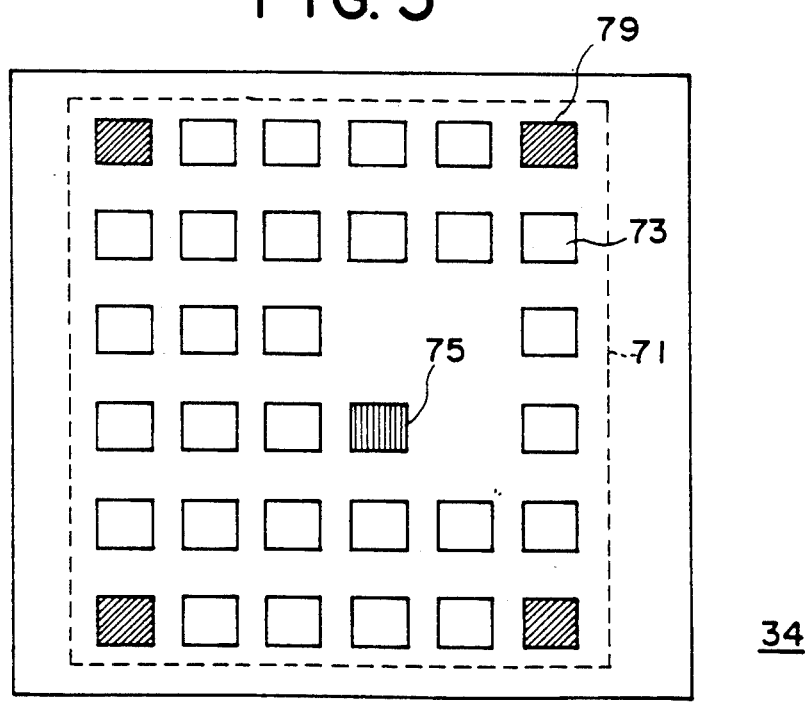
FIG. 6 is a diagram showing an actual construction of the mask used in the system of FIG. 4.

FIG. 6 shows an actual construction of the mask 34. Referring to FIG. 6, a number of the patterns 73 typically having a size of about 300–500 μm for each edge are a ranged in the area 71 in a row and column formation except for a vicinity of a rectangular cutout 75 which is provided at a generally central part of the mask 34 close to the optical axis L for the variable shaping of the electron beam. As the variable beam shaping is performed by shifting or offsetting the electron beam B relative to the cutout 75, the pattern 73 should not be provided in the vicinity of the cutout so as to avoid the leakage of the shifted electron beam B through neighbouring pattern 73. Note that there are further provided a reference marker 79 at a suitable place on the mask 34 for the mask alignment.

Using the mask of FIG. 6, a large variety of patterns 73 can be provided on the mask 34. Thus, one can perform the patterning efficiently by selecting one of the patterns 73 and writing the selected pattern in one shot. Note that a shot for such a predetermined pattern would take a long time if the pattern is written one shot by one shot by a finely focused electron beam having a submicron size, for example. This means that the use of electromagnetic deflector 32, which has a large response time which may be about 0.1-1 msec, does not cause inconvenience such as the decrease of efficiency in the patterning process. On the other hand the variable shaped beam is used to write an irregular pattern by changing the size and shape of the beam in each shot. This means that the desired pattern has to be written by a number of repetition of shots while changing the size and shape of the beam in each shot. Thus the variable shaping of the beam has to be made instantly For this purpose, the present invention uses the electrostatic deflector 30 having a fast response time which may be about 0.1-1 μsec in combination with the cooperating cutout 75 provided in a vicinity of the optical axis.

Figure 7:
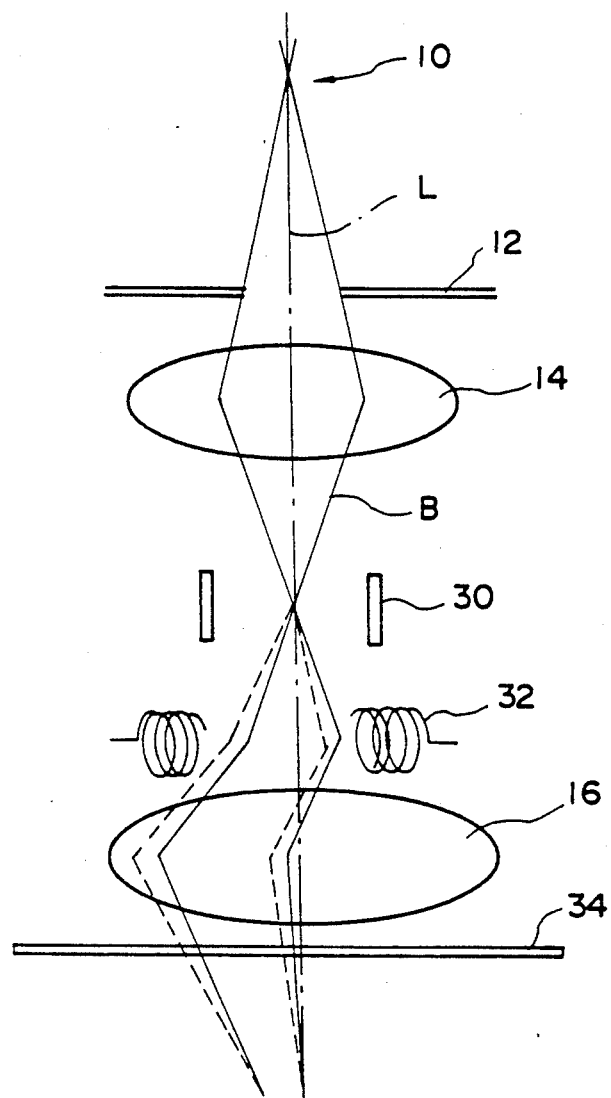
FIG. 7 is an enlarged view showing a part of the system of FIG. 4.

FIG. 7 shows the foregoing selection of the pattern 73 and the cutout 75 in the system of FIG. 4. Referring to the drawing showing a part of the system of FIG. 4 in an enlarged scale, the electron beam B passing along an optical axis L is deflected by the electromagnetic deflector 32 as illustrated by a continuous line or a broken line. After the deflection, the electron beam is returned to the path extending along the optical axis L by the focusing action of the electron lens 16 which focuses the electron beam to the crossover point 16x located on the optical axis L. The electron beam B thus passed through the lens 16 is then passed through the mask 34 at a selected aperture on the mask as already described before passing through the crossover point 16x. After passing through the crossover point 16x, the electron beam is demagnified by the lenses 22 and 24 and is focused on a surface of wafer 26 by the objective lens 24. The electron beam is further moved over the surface of the wafer 26 by the main and sub-deflectors 24a and 24b.

Next, description will be made on the operation of the system of FIG. 4 by again referring to the drawing.

The electron beam lithography system of the present embodiment uses a control system which comprises a central processing unit (CPU) 40 and a large capacity storage means such as a magnetic disk storage 42 or a magnetic tape storage 44 in which a control program and the like for controlling the system are stored. When a shot using the variable shaped beam is selected by the program, the CPU 40 sends a command to a pattern controller 50 via an interface 46 and a data memory 48, and the pattern controller 46 produces a control data specifying the deflection angle of the electron beam B in correspondence to the desired beam size and shape. This control data is then applied to the electrostatic deflector 30 in a form of a control voltage after digital-to-analog conversion in a D/A converter 51. The D/A converter 51 produces the control voltage corresponding to the desired angle of deflection and the electron beam B is moved over the mask 34 of FIG. 6 such that only the desired portion of the electron beam is passed through the cutout 75. As already noted, the response of the electrostatic deflector is instantaneous and a series of continuous shots can be achieved at a high speed while changing the size and shape of the beam in each shot.

When a shot by the shaped electron beam shaped according to one of the predetermined patterns 73 is selected by the program, on the other hand, the CPU 40 sends a command to the pattern controller 50 via the interface 46 and the data memory 48 similarly to the foregoing case, whereby the pattern controller 50 produces a control data specifying a deflection angle of the electron beam for addressing the selected pattern 73 and the control data is converted into a control current to be supplied to the electromagnetic deflector 32 by a D/A converter 52. Responsive to the control current, the electron beam B is deflected by the foregoing specified angle and the electron beam moves over the mask 34 to the selected pattern 73. As a result of use of the electromagnetic deflector 32, the angle of deflection of the electron beam B can be set large and a large number of patterns 73 can be provided on the mask 34.

The pattern controller further supplies a control data to a blanking controller 54 responsive to a command by the CPU 40 when interrupting the exposure. Responsive to the control data, the blanking controller 54 produces a blank control data and the blank control data is supplied to another electrostatic deflector 36 after a digital-to-analog conversion in a D/A converter 55. Responsive thereto, the electron beam is shifted from the optical path L passing through the pinhole 23 and the electron beam is disappeared from the surface of the wafer 26.

Further, the electron beam is moved over the surface of the wafer 26 responsive to the command signal from the CPU 40 which is supplied to a sequential controller 56 via the interface 46. Thus, the sequential controller 56 produces a data specifying the position of the electron beam on the wafer 26 and the data is supplied to a deflection controller 57. The deflection controller 57 in turn produces a first deflection control data representing the angle of deflection of the electron beam to be achieved by the main deflector 24a and a second deflection control data representing the angle of deflection of the beam to be achieved by the sub-deflector 27b. The first deflection control data is then converted to a deflection control current by a D/A converter 58 and is supplied to the main deflector 24a. Similarly, the second deflection control data is converted to a deflection control voltage by a D/A converter 59 and is applied to the sub-deflector 24b.

Further, the sequential controller 56 supplies a stage control data specifying a desired position of the stage 28 to a stage controller 61 responsive to the command from the CPU 40 and the stage controller changes the position of the stage according to the stage control data supplied thereto. Further, the position of the stage 28 is monitored by a laser interferometer 59 and the deflection angle of the electron beam on the wafer 26 is adjusted according to the result of the positional measurement of the stage 28 by the laser interferometer 60.

Next, a second embodiment of the present invention will be described with reference to FIG. 8. In the drawing, the parts corresponding to those parts already described with reference to the preceding drawings are given identical reference numerals and the description thereof will be omitted.

Figure 8:
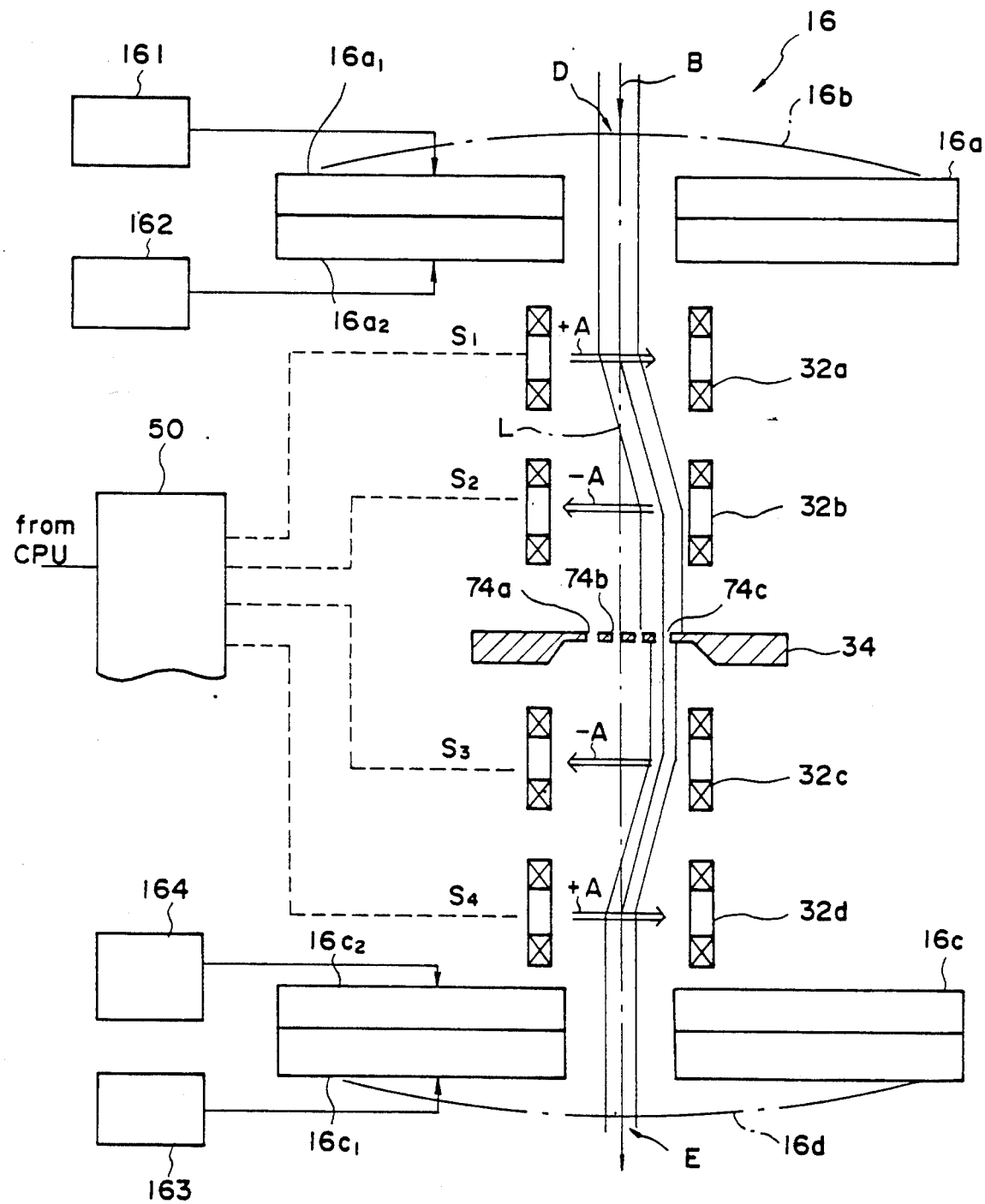
FIG. 8 is a diagram showing a second embodiment of the electron beam lithography system according to the present invention.

Referring to FIG. 8, the electron lens 16 used in this embodiment comprises an upper lens 16a located at a side of the mask 34 closer to the electron gun 10 and a lower lens 16b located at the other side of the mask 34 closer to the stage 26. Thus, the electron lens 16 of this embodiment forms a lens system. Further, the present embodiment uses four electromagnetic deflectors 32a–32d provided between the electron lens 16a and the electron lens 16c in place of the electromagnetic deflector 32, in which two of them (32a and 32b) are disposed above the mask 34 and the remaining two of them (32c and 32d) are disposed below the mask. The electromagnetic deflectors 32a–32d are energized by control currents $S_1$–$S_4$ supplied from the pattern controller 50. In FIG. 8, the D/A converter 52 is omitted for the sake of simplicity. Typically a current of about $\pm 2$–3 amperes is supplied as the control currents $S_1$–$S_4$ while applying a voltage of about $\pm 30$ volts to the electrostatic deflector 30.

Responsive to the control current $S_1$ produced by the pattern controller 50 under the control of the CPU 40, the electromagnetic deflector 32a produces a magnetic field $+A$ as shown in the drawing. On the other hand, the electromagnetic deflector 32b located between the electromagnetic deflector 32a and the mask 34 produces a magnetic field $-A$ having a same magnitude but an opposite direction as also illustrated in the drawing. Further, the electromagnetic deflector 32c located below the mask 34 is supplied with the control current S3 from the pattern controller 50 and produces a magnetic filed −A which is identical to the magnetic field produced by the electromagnetic deflector 32b. Further, the electromagnetic deflector 32d produces a magnetic field +A which is identical to the magnetic field produced by the electromagnetic deflector 32a.

When the electron beam B traveling along the optical axis L is passed through the upper electron lens 16a, the electron beam is deflected away from the optical axis L by the action of the magnetic field +A of the electromagnetic deflector 32a. The electron beam thus deflected is then deflected again by the magnetic field −A of the electromagnetic deflector 32b acting in the opposite direction with a same strength and the electron beam assumes a path extending parallel to the optical axis L but offset therefrom. Thus, the electron beam B passes through the mask 34 perpendicularly. After passing through the mask 34, the electron beam is again deflected by the magnetic field −A produced by the electromagnetic deflector 32c toward the optical axis L by a same deflection angle as that when the beam is deflected by the electromagnetic deflector 32b. When returned on the optical axis L, the electron beam B is further deflected by the magnetic field +A produced by the electromagnetic deflector 32d by a deflection angle which is the same as that when the beam is deflected by the electromagnetic deflector 32a. As a result, the electron beam B is returned to the optical axis L and passes through the lower electron lens 16c along the optical axis L. In other words, the electron beam B enters to and exits from the lens system 16 substantially along the optical axis L even when the electron beam B is deflected for selectively addressing a desired pattern on the mask 34.

As a result, the problem of spherical abberation is entirely eliminated. Further, the problem of unwanted demagnification of the image on the wafer 26 associated with the oblique incidence of the electron beam to the lens system 16 is entirely eliminated. Further, as a result of use of the electromagnetic deflectors, a large deflection angle is achieved and a wide variety of patterns on the mask 34 can be addressed by the electron beam B as desired similarly to the foregoing embodiment.

It is advantageous if the control currents S2 −S4 are determined uniquely by the control current S1 in the controller 50 as the control currents S2–S4 are in principle dependent on the control current S1. By calibrating the actual deflection angle of the deflectors 32a–32d in advance, such a automatic determination of the control currents S2–S4 by the control current S1 becomes possible. By doing so, the load of the controller 50 can be reduced and the efficiency of the patterning process is improved.

Figure 9:
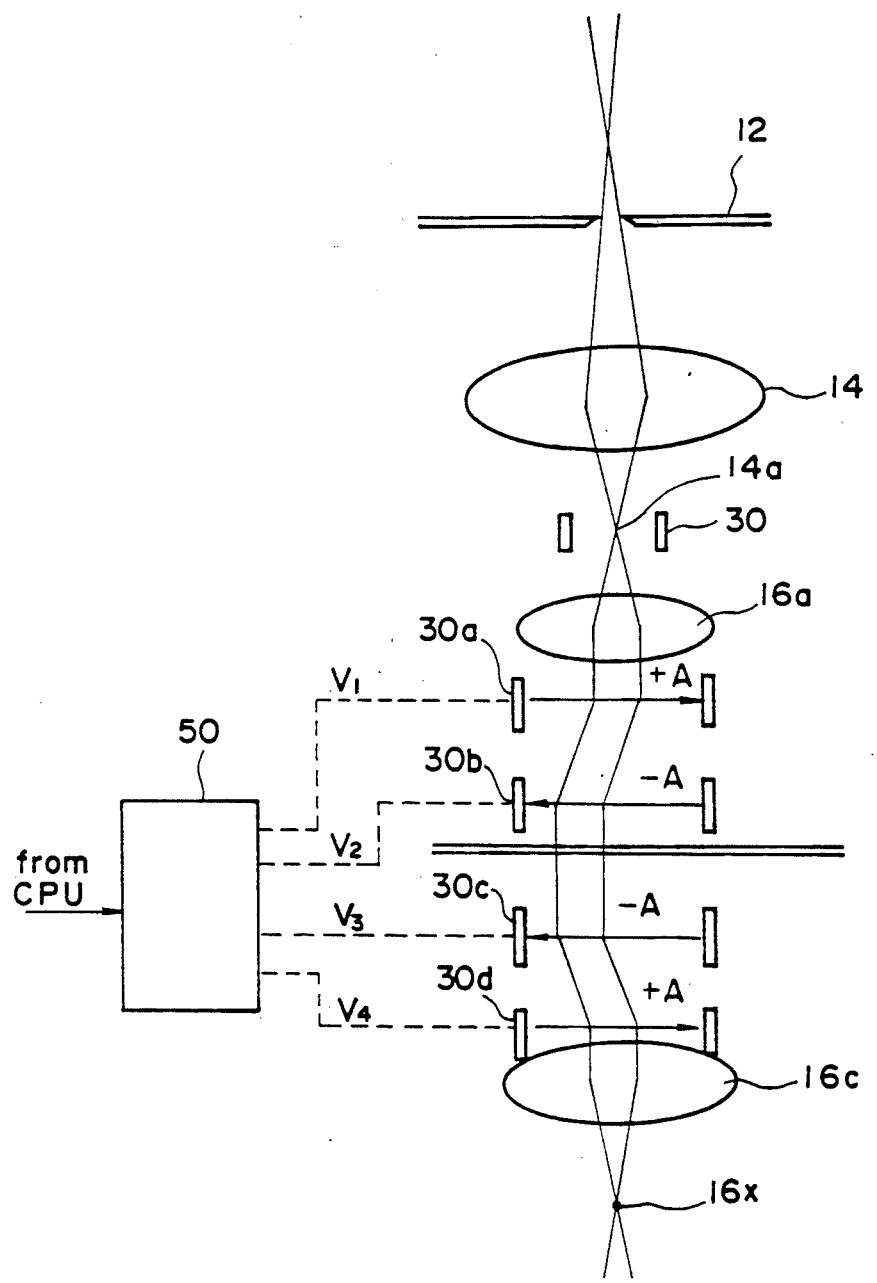
FIG. 9 is a diagram showing a modification of the system of FIG. 8.

When deflecting the electron beam B by the electrostatic deflector 30 (FIG. 4) for the variable shaping of the beam, the deflection angle is generally small. Thus, the construction of the deflector 30 for achieving the entering the exiting of the electron beam B in coincidence with the optical axis L is not absolutely necessary. However, a similar deflector arrangement for realizing this can be easily constructed from FIG. 8 as shown in FIG. 9. Referring to FIG. 9 showing a modification of the system of FIG. 8, four electrostatic deflectors 30a–30d are provided in place of the electrostatic deflector 30 of FIG. 4 such that two of them (30a and 30b) are located above the mask 34 and two of them (30c and 30d) are located below the mask 34. Each of the electrostatic deflectors 30a–30d is supplied with one of control voltages $V_1$–$V_4$ from the pattern controller 50 under the control of the CPU 40 and deflects the electron beam B similarly to the case of FIG. 8. For this purpose, the pattern controller 50 controls the voltages $V_1$–$V_4$ such that an electric field having a same magnitude A but an opposite direction is established across a pair of electrodes forming the deflector. Thus, an electric field +A is formed by the electrostatic deflector 30a responsive to the control voltage $V_1$, an electric field −A is formed by the electrostatic deflector 30b responsive to the control voltage $V_2$, an electric field −A is formed by the electrostatic deflector 30c responsive to the control voltage $V_3$ and an electric field +A is formed by the electrostatic deflector 30d responsive to the control voltage $V_4$. Other operational principle is obvious from the foregoing description for the system of FIG. 8 and further description of this system will be omitted. Typically, a voltage of about ±200–250 V is applied for a deflection angle of ±1–1.5 mm. According to this modification, a very quick deflection of the electron beam is possible. Although the angle of deflection achieved by this system is smaller than that obtained by the system of FIG. 8, the system is effective when used in the case where a small deflection is needed with a very quick response.

In the embodiment of FIG. 8 or FIG. 9, a doublet lens system is used for the electron lenses 16a and 16b in order to correct the rotation of the image. Such a rotation of the image is caused by the mask provided in the optical path of the electron beam. Conventionally, the rotation of the image has been corrected by rotating the mask. However, the rotation of the mask 43 in the system of the present invention is not preferable as such a rotation of the mask 34 causes a displacement of the patterns on the mask. The correction for the rotation of the image itself can be performed by a singlet electromagnetic lens. However, if such a singlet lens is used, the intensity of the magnetic field is also changed responsive to the rotation correction and the parallelism of the electron beam is lost or degraded.

In the present system, the electron lens 16a is formed as a doublet lens system comprising a first lens coil $16a_1$ driven by a first power source 161 and a second lens coil $16a_2$ driven by a second power source 162 as shown in FIG. 8 so as to correct the rotation of the electron beam on the mask 34. For example, if the overall number of turns of the coils in the doublet lens system is one thousand, the first coil $16a_1$ may be turned for five hundred times and the second coil $16a_2$ may be turned also for five hundred times and a current I is supplied to each of the coils with mutually opposing directions. When the current I is supplied as such, the strength of the magnetic field, being proportional to $I^2$, is not affected by the direction of the current flowing through each of the coils but the angle of rotation of the image does change as it is proportional to I. Thus, by changing the ratio of the current I flowing through the first coil and second coil while maintaining the square of the overall current level at $I^2$, one can control the rotation of the image as desired. Thus, the rotation of the beam on the mask 34 can be easily corrected by adjusting the driving current supplied to each of the coils forming the doublet lens 16a. Similarly, the lower electron lens 16c is constructed as a doublet lens system comprising a first lens coil $16a_3$ and a second lens coil $16a_4$ driven by power sources 163 and 164 so as to correct the rotation of the image focused on the wafer 26. Note that the correction of rotation of the beam by any lens coil provided below the lens 16c without using the doublet construction for the lens 16c is unrealistic as such a correction, performed each time the mask is replaced, inevitably invites change of strength of the magnetic field.

According to the description for the foregoing embodiments, it will be apparent that the deflection for a small angle such as the case of variable shaping of the beam or small shift of the beam is made by the electrostatic deflector having a quick response while the deflection for a large angle is made by the electromagnetic deflector.

Next, a third embodiment of the present invention for controlling the electron beam in the system of FIG. 8 or FIG. 9 will be described. In the drawing, these parts already described with reference to the preceding drawings are given identical reference numerals and the description thereof will be omitted.

In the system of FIG. 8 or FIG. 9, it is necessary to adjust the electron beam such that the electron beam on the optical axis L is deflected and passed through a selected pattern on the mask 34 perpendicularly to the mask 34 and is returned to the optical axis L again responsive to the data specifying the selected pattern. For this purpose, a beam alignment process for adjusting the path of the electron beam is needed as the actual electron beam lithography system is more or less deviated from the ideal system.

Figure 10:
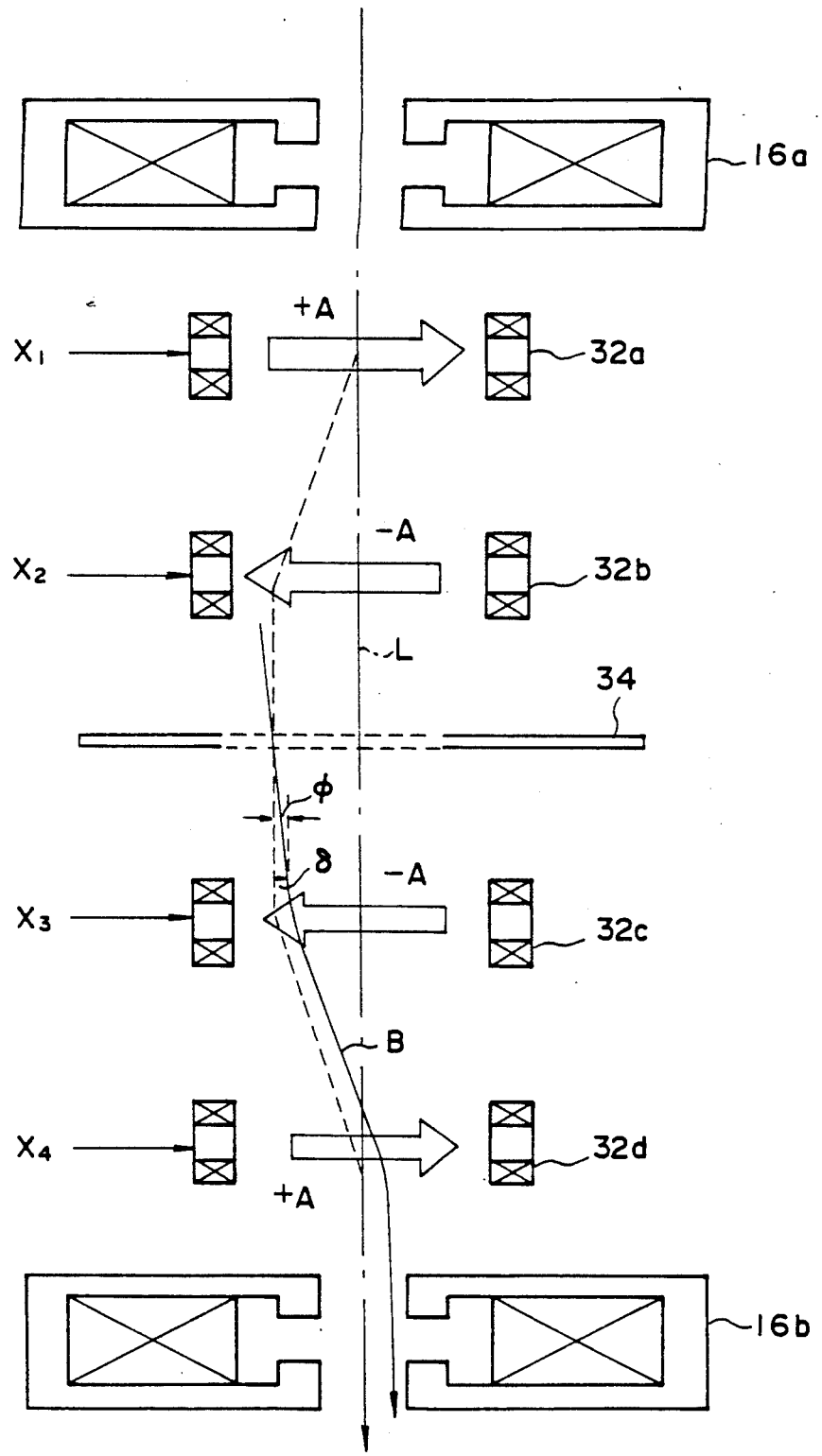
FIG. 10 is a diagram showing a part of the system of FIG. 8 in an enlarged scale.

Referring to FIG. 10 showing a typical situation, the electron beam is incident somewhat obliquely to the mask 34 and as a result of the deflection by the electromagnetic deflectors 32c and 32d, the beam exited from the lower electron lens 16b is offset from the optical axis L. As a result of such an offset, the electron beam B is focused on the wafer 26 at a position which is deviated from the desired position or is prevented from arriving at the wafer 26 by the round aperture 23. The present invention provides a method of adjusting the path of the electron beam B by once decomposing the offset of the electron beam into an angular offset component $\phi$ representing a deviation of the beam direction from vertical and further into a lateral offset component $\delta$ representing a lateral deviation of the beam from the properly aligned beam path, and further by changing these offset components $\phi$ and $\delta$ independently. Note that when the same adjustment is attempted by energizing the electromagnetic deflectors 32c and 32d independently, these offset components are changed simultaneously and the proper adjustment of the electron beam path becomes extremely difficult. This means that it takes a long time for achieving the beam alignment and the cost of the semiconductor device manufactured using the electron beam lithography technique is increased.

Figure 11:
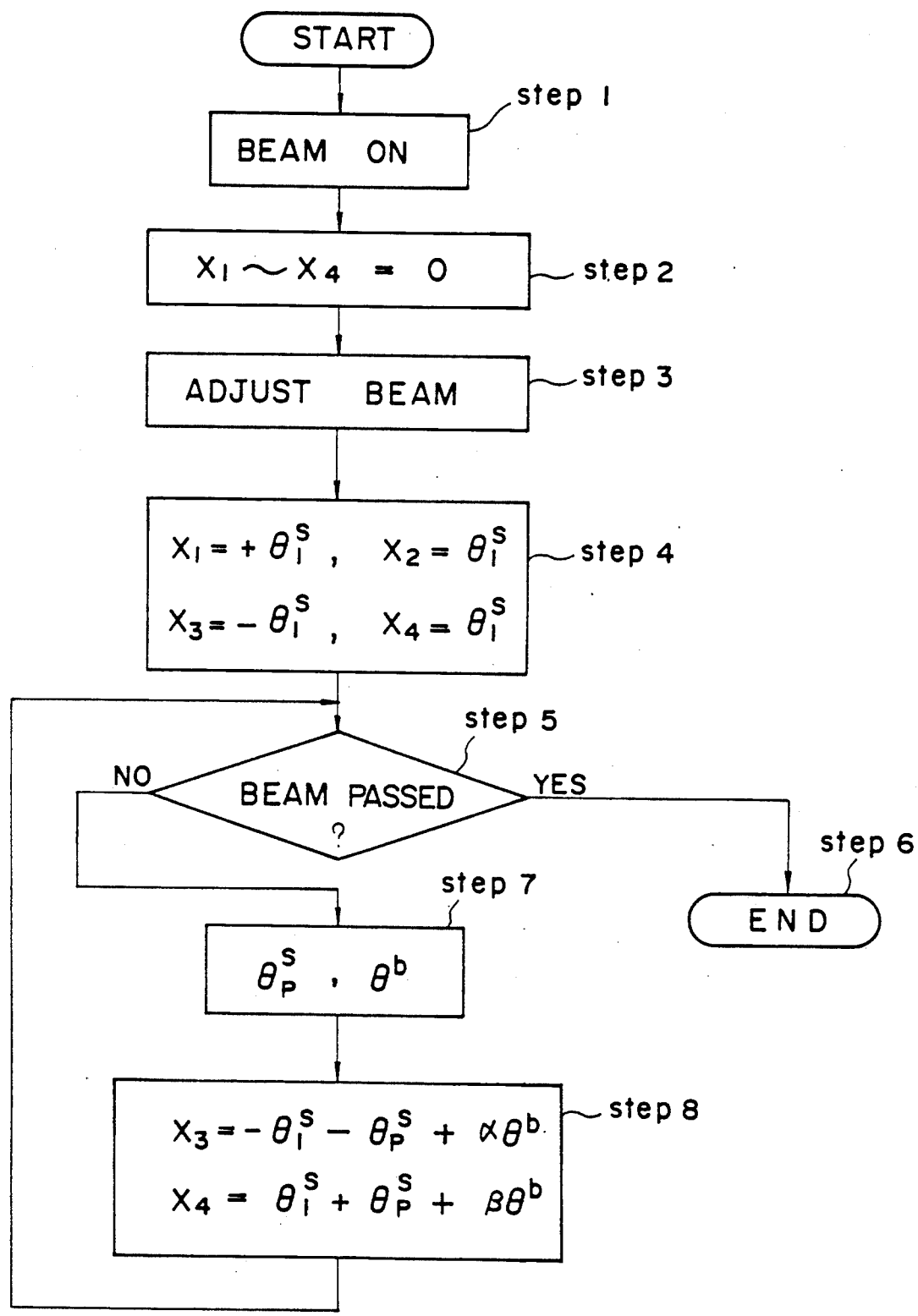
FIG. 11 is a flowchart for explaining the beam alignment in the system of FIG. 8.

FIG. 11 shows a flowchart for the beam alignment process according to the present embodiment. Referring to the drawing, the electron gun 10 is turned on in a step 1 and the electron beam B is formed. In a step 2, electrical energizations $X_1$–$X_4$ which may be the control currents $S_1$–$S_4$ to the electromagnetic deflector 32a–32d are deenergized. In other words, the electron beam B is passed through the electromagnetic deflectors straight without deflection. The step 2 may be performed simultaneously or prior to the step 1. Next, the beam adjusting system 11 shown in FIG. 4 is adjusted in a step 3 until the electron beam B is passed through the pinhole 23.

Next, in a step 4, the electric, energizations $X_1$–$X_4$ are set respectively to $+\theta_1^s$, $-\theta_1^s$, $-\theta_1^s$ and $+\theta_1^s$ such that the electromagnetic deflectors 32a–32d produce the magnetic fields $+A$, $-A$, $-A$ and $+A$ as already described. As a result of the energization in the step 4, the electron beam is deflected as already described with reference to FIG. 8. If the alignment is ideal, the electron beam passes through an ideal path shown in FIG. 10 by a broken line and no further adjustment is necessary.

In a next step 5, it is discriminated if the electron beam thus deflected is passed through the foregoing pinhole 23 or not. If the result is YES, the beam alignment process is completed and the process is stopped at a step 6. On the other hand, if the result is NO, a parameter $\theta_p^s$ for the adjustment of the lateral offset $\delta$ and a parameter $\theta^b$ for the adjustment of the angular offset $\phi$ are changed in a step 7. Further, in a step 8, the electric energization $X_3$ and the electric energization $X_4$ for the electromagnetic deflectors 32c and 32d are produced in the pattern controller 50 according to the equations:

$$X_3 = -\theta_1^s - \theta_p^s + \alpha \cdot \theta^b,$$

and $$X_4 = +\theta_1^s + \theta_p^s + \beta \cdot \theta^b.$$

where $\alpha$ and $\beta$ are constants.

After the step 8, the discrimination in the step 5 is performed again and the steps 6, 7 and 8 are repeated with a different combination of the electric energizations $\theta_p^s$ and $\theta^b$ until the electron beam B is passed through the pinhole 23.

Figure 12A:
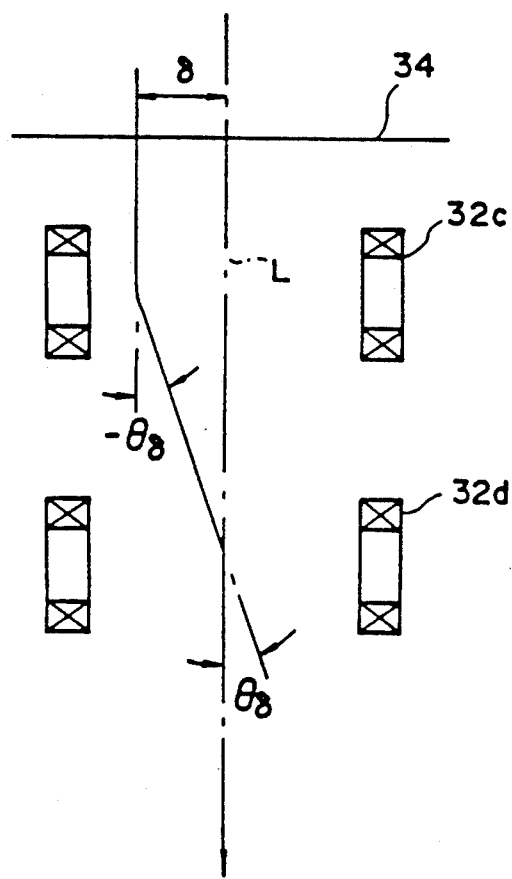
FIGS. 12(A) and (B) are diagrams showing the independent correction for lateral offset and angular offset of the electron beam according to the present invention.
Figure 12B:
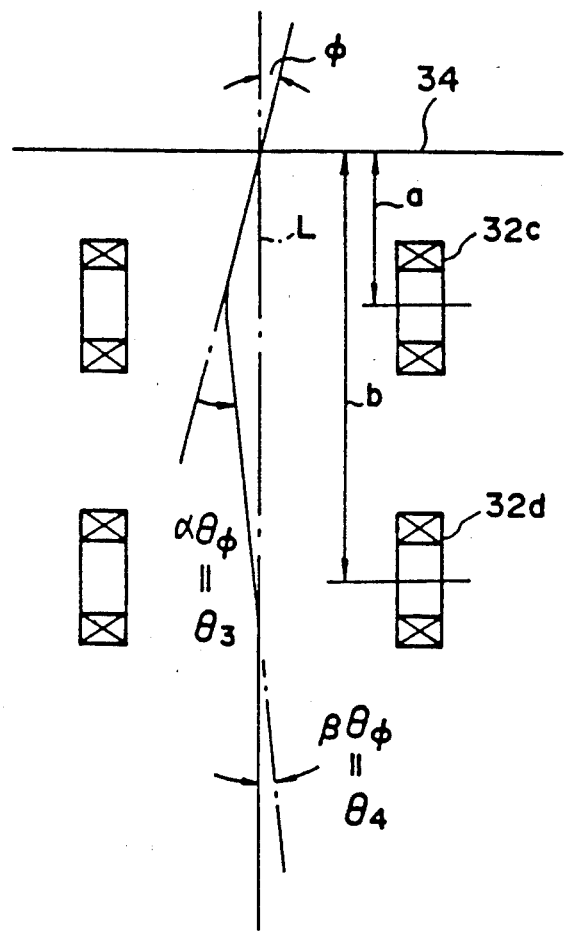

FIG. 12(A) shows the adjustment of the lateral offset $\delta$ of the electron beam B responsive to the change of the electric energization $\theta_p^s$ and FIG. 12(B) shows the adjustment of the angular offset $\theta$ of the electron beam B responsive to the change of the electric energization $\theta^b$. By changing the electric energization $X_3$ and $X_4$ according to the foregoing linear combination, the adjustment for the lateral offset component $\delta$ in FIG. 12(A) and the adjustment of the angular offset component $\delta$ in FIG. 12(B) can be performed independently and the process for alignment of the electron beam becomes significantly easier. Note that FIG. 12(B) shows a relation between the parameter $\alpha$ and the parameter $\beta$. From an elementary geometry, it will be understood that there holds a relation $$\alpha \cdot \theta_\phi = -\phi - \beta \cdot \theta_\phi \quad (1)$$

where the parameters are as specified in the drawing.

Further, there holds a relation $$a \cdot \phi = (b-a) \cdot \beta \cdot \theta_\phi \quad (2)$$

where a is a position of the electromagnetic deflector 32c measured from the mask 34 and b is a position of the electromagnetic deflector 32d measured from the mask 34. From Eqs.(1) and (2), it is easily derived that there holds a relation $\alpha/\beta = -b/a$.

Figure 13:
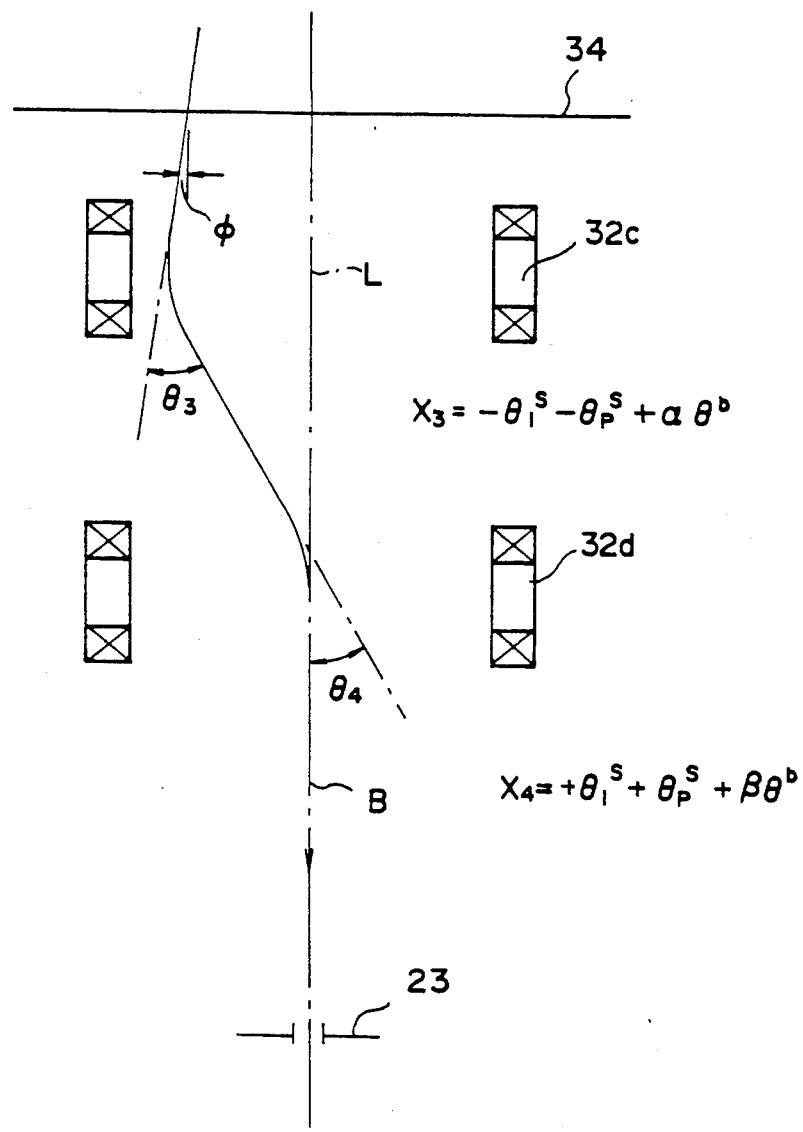
FIG. 13 is a diagram showing a state in which the alignment of the electron beam is completed.

FIG. 13 shows a situation in which the beam alignment is achieved properly. Note that the electric energization $X_3$ is increased by $-\theta_p^s + \alpha \cdot \theta^b$ relative to the initial value of $-\theta_1^s$ and the electric energization $X_4$ by $+\theta_p^2 + \beta \cdot \theta^b$. Responsive thereto, deflection angles $\theta_3$ and $\theta_4$ are changed and the electron beam B returns exactly on the optical axis L.

It should be noted that the foregoing adjustment is not limited to the electromagnetic deflectors 32c and 32d but also applicable to the electromagnetic deflectors 32a and 32b. As the adjustment of the beam path using the deflectors 32a and 32b is obvious from the foregoing description, the description for this case will be omitted.

Note that the charged particle beam is not limited to the electron beam but other charged particle beams such as proton beam or ionic beam may be used.

Figure 1:
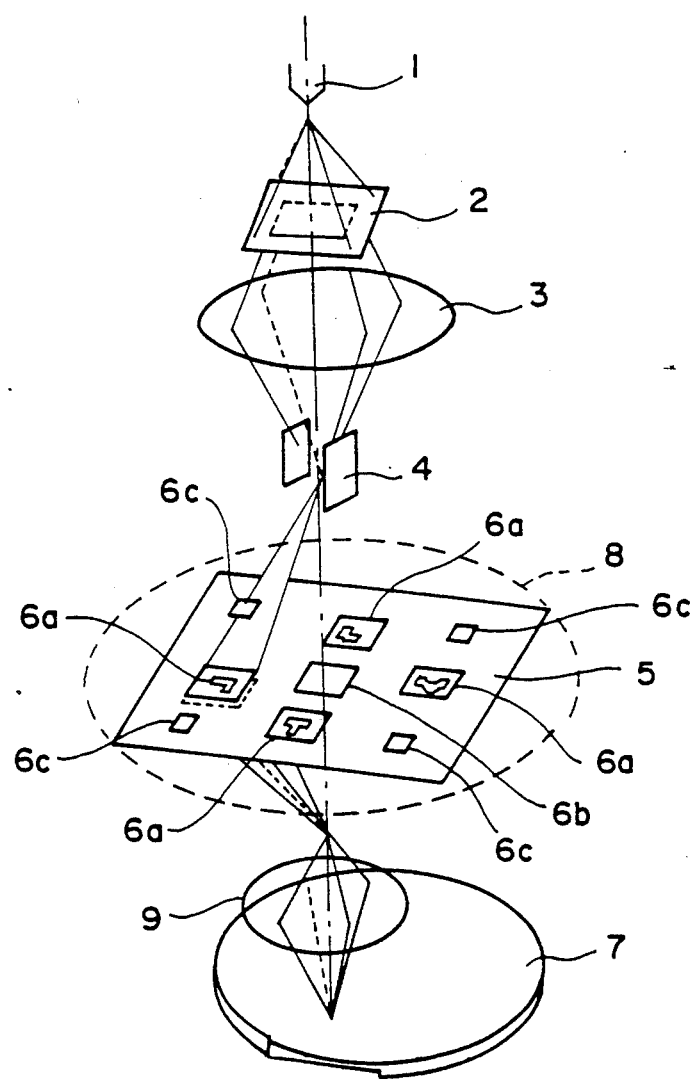
FIG. 1 is a schematical view showing a prior art electron beam lithography system.

Further, the present invention is not limited to the system for writing a pattern on a semiconductor substrate but one may write a pattern on a reticle 26' by placing it in the place of the semiconductor wafer 26 as shown in FIG. 1.

Further, the present invention is not limited to these embodiments described heretofore but various variations and modifications may be made without departing from the scope of the invention.

What is claimed is:

1. A charged particle beam lithography system for drawing a pattern on an object by a charged particle beam, comprising:

beam source means for producing and directing said charged particle beam such that the beam travels along a predetermined optical axis toward the object;

beam shaping means provided on a path of a travelling charged particle beam for providing a predetermined cross section to said charged particle beam;

first focusing means provided between the beam shaping means and the object for focusing the charged particle beam supplied from the beam shaping means on a first crossover point located on the optical axis;

second focusing means provided between the first crossover point and the object for focusing the charged particle beam previously focused on the first crossover point, on a second crossover point located on the optical axis;

beam deflection means for deflecting the charged particle beam focused by the second focusing means such that the beam is moved over the object;

stage means for supporting the object;

mask means provided in a vicinity of said first focusing means so as to extend substantially perpendicularly to the optical axis for interrupting the charged particle beam, said mask means carrying a plurality of apertures for providing a predetermined shape to the charged particle beam when the charged particle beam is passed therethrough; and addressing means for selectively deflecting the charged particle beam such that the charged particle beam is passed through a selected one of the apertures on the mask means, said addressing means comprising an electrostatic deflector for deflecting the charged particle beam such that the charged particle beam is passed through a predetermined aperture in the mask means for variable shaping of the charged particle beam, and at least one electromagnetic deflector for deflecting the charged particle beam for an angle at least larger than that cased by the electrostatic deflector such that the charged particle beam is selectively passed through said selected one of the apertures, said addressing means determining the position of the charged particle beam on the mask means by said electrostatic deflector and said electromagnetic deflector.

2. A charged particle beam lithography system as claimed in claim 1 in which said charged particle beam comprises an electron beam.

3. A charged particle beam lithography system as claimed in claim 1 in which said object comprises a semiconductor substrate.

4. A charged particle beam lithography system as claimed in claim 1 in which said object comprises a reticle.

5. A charged particle beam lithography system as claimed in claim 1 in which said plurality of apertures are disposed on the mask means in a region having a size of about 2-5 mm×2-5 mm and said electromagnetic deflector is capable of deflecting the charged particle beam on the mask means for a distance of at least about 2-5 mm.

6. A charged particle beam lithography system as claimed in claim 1 in which each of said plurality of apertures have a general size of 300-500 $\mu$m×300-500 $\mu$m and said plurality of apertures, excluding said predetermined aperture, have a shape corresponding to an elementary pattern to be written repeatedly on the object.

7. A charged particle beam lithography system as claimed in claim 1 in which said predetermined aperture on the mask means is provided in a vicinity of the optical axis.

8. A charged particle beam lithography system for drawing a pattern on an object by a charged particle beam, comprising:

beam source means producing and directing said charged particle beam such that the beam travels along a predetermined optical axis toward the object;

beam shaping means provided on a path of a traveling charged particle beam for providing a predetermined cross section to said charged particle beam;

first focusing means provided between the beam shaping means and the object for focusing the charged particle beam supplied from the beam shaping means on a first crossover point located on the optical axis;

second focusing means provided between the first crossover point and the object for focusing the charged particle beam previously focused on the first crossover point, on a second crossover point located on the optical axis;

beam defection means for deflecting he charged particle beam focused by the second focusing means such that the beam is moved over the object;

stage means for supporting the object;

mask means provided in a vicinity of said first focusing means so as to extend substantially perpendicularly to the optical axis for interrupting the charged particle beam, said mask means carrying a plurality of apertures for providing a predetermined shape to the charged particle beam when the charged particle beam is passed therethrough; and addressing means for selectively deflecting the charged particle beam such that the charged particle beam is passed through a selected one of the apertures on the mask means, said addressing means comprising an electrostatic deflector for deflecting the charged particle beam such that the charged particle beam is passed through a predetermined aperture in the mask means for variable shaping of the charged particle beam, and at least one electromagnetic deflector for deflecting the charged particle beam for an angle at least larger than that cased by the electrostatic deflector such that the charged particle beam is selectively passed through said selected one of the apertures, wherein said first focusing means comprises a first electromagnetic lens provided at a side of the mask means closer to the beam source means so as to receive the charged particle beam traveling along the optical axis for bending the path of the charged particle beam incident thereto such that charged particles in the beam travel, after passing through the first electromagnetic lens, substantially parallel to each other, and a second electromagnetic lens provided at the other side of the mask means for focusing the charged particle beam passed through part of said addressing means is provided between said first and second electromagnetic lenses.

9. A charged particle beam lithography system as claimed in claim 8 in which said addressing means comprises a first electromagnetic deflector provided between the first electromagnetic lens and the mask means for deflecting the charged particle beam away from the optical axis, a second electromagnetic deflector provided between the first electromagnetic deflector and the mask means for deflecting the charged particle beam deflected by the first electromagnetic deflector such that the charged particle beam is travelled parallel to the optical axis but offset therefrom and incident to the mask means perpendicularly, a third electromagnetic deflector provided between the mask means and the second electromagnetic lens for deflecting the charged particle beam passed through the aperture on the mask means toward the optical axis, and a fourth electromagnetic deflector provided between the third electromagnetic deflector and the second electromagnetic lens for deflecting the charged particle beam deflected by the third electromagnetic deflector such that the changed particle beam travels on the optical axis.

10. A charged particle beam lithography system as claimed in claim 9 further comprising a controller for supplying a driving current to said first, second, third and fourth electromagnetic deflectors such that the first electromagnetic deflector produces a first magnetic field having a predetermined strength in a predetermined direction, the second electromagnetic deflector produces a second magnetic field having an identical strength to said predetermined strength in a direction opposite to said predetermined direction, the third electromagnetic deflector produces a third magnetic field having a strength and direction identical to that produced by the second electromagnetic deflector, and that said fourth electromagnetic deflector produces a fourth magnetic field having a strength and direction identical to that produced by the first electromagnetic deflector.

11. A charged particle beam lithography system as claimed in claim 10 in which said controller is supplied with a command signal specifying the selected aperture and further controls the control current responsive to the command signal such that the charged particle beam is passed through the selected aperture on the mask means.

12. A charged particle beam lithography system as claimed in claim 11 in which said controller produces a first control current to the first electromagnetic deflector responsive to the command signal and further produces a second, third and fourth control currents respectively to the second, third and fourth electromagnetic deflectors according to the first control current such that the second control current has a same magnitude and an opposite polarity, the third control current has the same magnitude and the opposite polarity and the fourth control current has the same magnitude and the same polarity.

13. A charged particle beam lithography system for drawing a pattern on an object by a charged particle beam, comprising:

beam source means for producing and directing said charged particle beam such that the beam travels along a predetermined optical axis toward the object;

beam shaping means provided on a path of the traveling charged particle beam for providing a predetermined cross section to said charged particle beam;

first focusing means provided between the beam shaping means and the object for focusing the charged particle beam supplied from the beam shaping means on a first crossover point located on the optical axis, said first focusing means comprising a first electromagnetic lens for receiving the charged particle beam traveled along the optical axis from the beam shaping means for bending the path thereof such that charged particles in the beam travels, after passing through the first electromagnetic lens, substantially parallel to each other, and a second electromagnetic lens for focusing the charged particle beam passed through the first electromagnetic lens at the first crossover point;

second focusing means provided between the first crossover point and the object for focusing the charged particle beam previously focused on the first crossover point, on a second crossover point located on the optical axis;

beam deflection means for detecting the charged particle beam focused by the second focusing means such that the beam is moved over the object;

stage means for supporting the object;

mask means provided between said first electromagnetic second electromagnetic lens for interrupting the charged particle beam, said mask means carrying a plurality of apertures for providing a predetermined shape to the charged particle beam when the charged particle beam is passed therethrough; and addressing means for selectively deflecting the charged particle beam such that the charged particle beam is passed through a selected one of the apertures on the mask means, said addressing means comprising a first electrostatic deflector provided between the first electromagnetic lens and the mask means for deflecting the charged particle beam away from the optical axis, a second electrostatic deflector provided between the first electrostatic deflector and the mask means for deflecting the charged particle beam deflected by the first electromagnetic deflector such that the charged particle beam is travelled parallel to the optical axis and incident to the mask means perpendicularly, a third electrostatic deflector provided between the mask means and the second electromagnetic lens for deflecting the charged particle beam passed through the aperture on the mask means toward the optical axis, and a fourth electrostatic deflector provided between the third electrostatic deflector and the second electromagnetic lens for deflecting the charged particle beam deflected by the third electrostatic deflector such that the changed particle beam travels on the optical axis.

14. A charged particle beam lithography system as claimed in claim 13 further comprising a controller for applying a control voltage to said first, second, third and fourth electrostatic deflectors such that the first electrostatic deflector produces a first electric field having a predetermined strength in a predetermined direction, the second electrostatic deflector produces a second electric field having an identical strength to said predetermined strength in a direction opposite from said predetermined direction, the third electrostatic deflector produces a third electric field having a strength and direction identical to that by the second electrostatic deflector, and that said fourth electrostatic deflector produces a fourth electric field having a strength and direction identical to that field produced by the first electrostatic deflector, and said controller produces the control voltage such that the charged particle beam is passed through at least a part of said predetermined aperture.

15. A charged particle beam lithography system as claimed in claim 8 in which said first electromagnetic lens comprises a first focusing coil driven by a first driving source and a second focusing coil driven by a second driving source independently from the first focusing coil for correcting a rotation of the charged particle beam on the stencil mask means, and said second electromagnetic lens comprises a third focusing coil driven by a third driving source and a fourth focusing coil driven by a fourth driving source independently from the third focusing coil for correcting a rotation of the charged particle beam on the object.

16. A method of drawing a pattern on a substrate by a charged particle beam, comprising steps of:
    producing the charged particle beam such that the charged particle beam travels toward the substrate along a predetermined optical axis;
    deflecting the charged particle beam away from the optical axis;
    passing the deflected charged particle beam through a selected one of a plurality of apertures provided on a mask;
    deflecting the deflected charged particle beam back to the optical axis; and
    focusing the charged particle beam passed through the selected aperture on the substrate;
    wherein said step of deflecting the charged particle beam away from the optical axis comprises a step of energizing an electrostatic deflector, when performing a variable shaping of the charged particle beam, such that a variable part of the deflected charged particle beam is passed through a predetermined aperture provided on the mask for forming a variable shaped beam and a step of energizing an electromagnetic deflector, when performing a shaping of the charged particle beam according to of plurality of predetermined patterns provided on the mask in a form of a plurality of patterned apertures, such that the deflected charged particle beam is passed through the selected patterned aperture.

17. A method of drawing a pattern on a substrate by a charged particle beam traveling from a beam source to the substrate along an optical axis, comprising steps of:
    deflecting the charged particle beam away from the optical axis by energizing first deflector means;
    deflecting the charged particle beam that has been deflected by the first deflector means by energizing second deflector means such that the charged particle beam is caused to pass through a selected one of a plurality of apertures provided on a mask disposed in the path of the charged particle beam;
    deflecting the charged particle beam passed through the selected aperture on the mask by energizing third deflector means such that the charged particle beam is moved toward the optical axis;
    deflecting the charged particle beam deflected by the third deflector means by energizing fourth deflector means such that the charged particle beam is moved toward the substrate along the optical axis; and
    focusing the charged particle beam deflected by the fourth deflector means on the substrate,
    said step of deflecting the charged particle beam by the first deflector means comprising a step of supplying a first electric energization having a magnitude and polarity specifying the selected aperture on the mask, said step of deflecting the charged particle beam by the second deflector means comprising a step of supplying a second electric energization having a magnitude identical to that of the first electric energization but a polarity opposite from that of the first electric energization, said step of deflecting the charged particle beam by the third deflector means comprising a step of supplying a third electric energization having a magnitude and polarity identical to that of the second energization, and said step of deflecting the charged particle beam by the fourth deflector means comprising a step of supplying a fourth electric energization having a magnitude and polarity identical to that of the first energization.

18. A method as claimed in claim 17 further comprising steps of monitoring a state of arrival of the charged particle beam on the substrate, modifying the third and fourth electric energizations according to a linearly independent combination of a first parameter representing a lateral displacement of the charged particle beam from an ideal beam path and a second parameter representing an angular displacement of the charged optical beam with respect to the ideal path while changing the first and second parameters independently, and repeating the steps of monitoring the beam and modifying the energizations until the charged particle beam arrives at the substrate properly.

19. A method as claimed in claim 18 in which said linearly independent combination comprises a relation $$X = -\theta_p^s + \alpha \cdot \theta^b$$

and $$Y = +\theta_p^s + \beta \cdot \theta^b$$

wherein X and Y stand for the third and fourth energizations, $\theta_p^s$ and $\theta^b$ are the first and second parameters, and $\alpha$ and $\beta$ are constants.

* * * * *

UNITED STATES PATENT AND TRADEMARK OFFICE
CERTIFICATE OF CORRECTION

PATENT NO. : 5,051,556

DATED : September 24, 1991

INVENTOR(S) : KIICHI SAKAMOTO, HIROSHI YASUDA and AKIO YAMADA

It is certified that error appears in the above-identified patent and that said Letters Patent is hereby corrected as shown below:

Column 12, line 33, "$\downarrow p^s$" should be --$\theta p^s$--;

line 38, "$\theta$" should be --$\phi$--;

line 43, "$\delta$" should be --$\phi$--;

Column 14 line 48, "he" should be --the--.

Column 15, line 2, "cased" should be --caused--.

Column 16, line 41, before "second" insert --lens and--.
Column 16, line 36, "detecting" should read --deflecting--.

Signed and Sealed this

Ninth Day of March, 1993

Attest:

STEPHEN G. KUNIN

*Attesting Officer*    *Acting Commissioner of Patents and Trademarks*